United States Patent [19]
Fisher et al.

[11] Patent Number: 5,745,989
[45] Date of Patent: May 5, 1998

[54] METHOD OF PREPARATION OF AN OPTICALLY TRANSPARENT ARTICLE WITH AN EMBEDDED MESH

[75] Inventors: Donald Fisher, Valley Center; Charles Warner, Murrieta, both of Calif.

[73] Assignee: Exotic Materials, Inc., Murrieta, Calif.

[21] Appl. No.: 511,392

[22] Filed: Aug. 4, 1995

[51] Int. Cl.$^6$ ........................................ H05K 3/02
[52] U.S. Cl. ........................................ 29/846; 219/203
[58] Field of Search ........................... 29/846; 219/203

[56] References Cited

U.S. PATENT DOCUMENTS

| | | | |
|---|---|---|---|
| 3,745,309 | 7/1973 | Gruss | 219/203 X |
| 4,010,304 | 3/1977 | Cohen | 219/203 X |
| 4,209,687 | 6/1980 | Bethge et al. | 219/203 X |
| 4,321,296 | 3/1982 | Rougier | 219/203 X |
| 4,455,481 | 6/1984 | Van Huff et al. | 219/203 X |
| 4,842,677 | 6/1989 | Wojnarowski et al. | |
| 4,930,731 | 6/1990 | Roy et al. | |
| 5,030,321 | 7/1991 | Coutandin et al. | |
| 5,043,567 | 8/1991 | Sakama et al. | |
| 5,126,081 | 6/1992 | Willingham et al. | |
| 5,225,251 | 7/1993 | Esrom | |
| 5,247,153 | 9/1993 | Pasch | |
| 5,324,374 | 6/1994 | Harmand et al. | 219/203 X |
| 5,354,966 | 10/1994 | Sperbeck | 219/203 |
| 5,368,911 | 11/1994 | Mannava et al. | |
| 5,481,400 | 1/1996 | Borden | 219/203 X |

OTHER PUBLICATIONS

Abstract/Summary of U.S. Patent 4,770,479.
Abstract/Summary of U.S. Patent 5,194,985.
M. Shimbo et al., "Silicon-silicon direct bonding method", *J. Appl. Phys.*, vol. 60(8), 1986, pp. 2987–2989.
T. Abe et al., "Silicon Wafer Bonding Mechanism for Silicon–on–Insulator Structures," *Japanese J. Appl. Phys.*, vol. 29 (12), 1990, pp. L2311–L2314.

*Primary Examiner*—Carl J. Arbes
*Attorney, Agent, or Firm*—Gregory Garmong

[57] ABSTRACT

An optically transparent article is prepared from an optically transparent first piece and an optically transparent second piece. A channel pattern is scribed into a surface of the first piece to a preselected depth. A metallic stripe pattern is deposited into the channel pattern, with the thickness of the metallic stripe pattern being less than the depth of the channel pattern. The second piece is placed over the first piece and sealed thereto at a peripheral boundary such that the second piece does not contact the metallic stripe pattern. A bus connection is optionally made to the metallic stripe, preferably from the periphery of either the first or second piece.

16 Claims, 2 Drawing Sheets

METHOD OF PREPARATION OF AN OPTICALLY TRANSPARENT ARTICLE WITH AN EMBEDDED MESH

BACKGROUND OF THE INVENTION

This invention relates to transparent articles used for windows and the like, and more particularly, to such articles that have metallic mesh embedded therein.

It is a common practice to place a grid of fine electrical conductors on or inside a transparent article. Depending upon the arrangement and dimensioning of the electrical conductors and the wavelength of the radiation impinging radiation, the grid can either permit the transmission of radiation through the transparent article or block its transmission. The grid, formed of a plurality of intersecting metallic stripes, is connected at the periphery of the article to an electrical ground or to a voltage source.

The grid can serve any of a variety of functions. An electrical current can be transmitted through the grid to heat the metallic stripes and thence the transparent article to accomplish de-icing, for example. In another application, the grid is electrically grounded and serves to block the intrusion of electromagnetic interference (EMI) into the interior of the structure in which the window is set, while permitting the transmission of light through the window.

The transparent article with its embedded grid and associated connections can be prepared by any of several approaches. In one, a pattern of thin conductive metallic stripes is deposited upon a transparent substrate. A second piece of the substrate material is placed over the first piece and pressed against the first piece, with the pattern of metallic stripes sandwiched between the two transparent pieces. In another approach, the pattern of thin conductive stripes is deposited upon a transparent substrate. A top layer is deposited overlying the pattern by vapor deposition or other technique.

The inventors have recognized that these techniques, while operable for some applications, have drawbacks when they are used in an attempt to prepare transparent windows (including flat windows and curved domes) of extremely high optical quality. In the approach where the grid is sandwiched between two solid pieces, the resulting stresses in the window diffract and thence distort the transmitted radiation. In the approach where the top layer is vapor deposited, the production of the required thin films can be difficult. Masking of the substrate is not readily accomplished, particularly at the periphery of the substrate so that external bus connections to the grid can be made. In both approaches, it is difficult to disassemble the window to gain access to the grid, in the event that repairs to the grid are necessary, for example.

There is a need for an improved approach to the incorporation of metallic grids into transparent structures. This approach should produce an optically high-quality window, while also permitting disassembly of the window for access to the grid in some cases. The present invention fulfills this need, and further provides related advantages.

SUMMARY OF THE INVENTION

The present invention provides a method for the fabrication of an optically transparent article having a pattern of metallic stripes incorporated therein, and the article made by the method. The metallic stripes can be produced with a wide range of widths, spacings, and patterns, permitting the grid structure to be tailored specifically for an intended application. The approach produces a final article of excellent optical transparency, in which there are no stress-induced distortions of the transmitted image. In one embodiment, the article can also be readily assembled, later disassembled for repair or other action if necessary, and thereafter re-assembled. The approach is readily implemented on a commercial scale using available apparatus.

In accordance with the invention, a method of fabricating an optically transparent article comprises the steps of providing an optically transparent first piece having a first surface and a first piece lateral periphery, and scribing a channel having a channel depth into the first surface of the first piece. The channel is preferably in the form of a pattern of intersecting channel segments. A metallic stripe is deposited into the channel, preferably by vapor deposition or a comparable technique. The stripe has a metallic stripe thickness, which is readily controlled during deposition, of less than the channel depth. The method further includes providing an optically transparent second piece having a second surface and a second piece lateral periphery, and placing the optically transparent second piece into contact with the optically transparent first piece with the second surface in contact with the first surface. The contacting faces of the first and second pieces are desirably polished, smooth, and flat. In this structure, the second piece does not contact the metallic stripe, which is recessed in the channel. Because the second piece does not contact the metallic stripe, there is no stress imposed upon either the metallic stripe or the transparent pieces. The optically transparent pieces can be selected to be transparent in any wavelength range of interest, such as, for example, the visible or infrared ranges.

After the transparent article is formed in this manner, bus connections are normally made to the metallic stripes at the periphery of either the first piece or the second piece, or their coinciding peripheries if they are of the same shape and dimension. The bus connections are connected to a voltage source or to ground, as may be required for a particular application. The periphery is sealed to prevent the intrusion of water, dirt, or chemicals into the interior of the grid structure. The attachment of the bus connections and the sealing can be done in this or the reverse order.

At a later time, it may be necessary to gain access to the interior of the article for repair, replacement of the second piece, changing the stripe pattern, or other reason. In that event, the first and second pieces are unsealed and separated to expose the channel and stripe pattern. The required changes are made, and the first and second pieces are again placed into facing contact and sealed. This access is readily achieved without damage to the transparent pieces or to the grid structure.

The present invention provides an advance in the art of transparent windows having metallic grids embedded therein. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
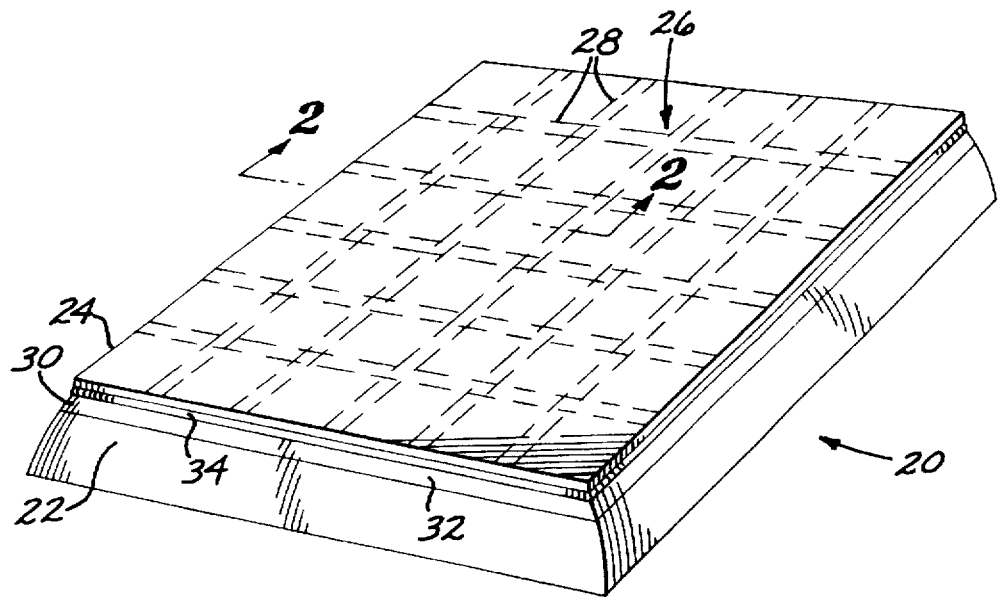
FIG. 1 is a perspective view of a transparent article made according to the approach of the invention.

FIG. 1 depicts an optically transparent article 20 formed of an optically transparent first piece 22 and an optically transparent second piece 24 affixed to the optically transparent first piece 22. A pattern 26 of a plurality of electrically conductive stripes 28 is positioned between the first piece 22 and the second piece 24, and thence embedded within the article 20. In the article 20 shown in FIG. 1, the pattern 26 is rectilinear with two parallel arrays of stripes 28 that intersect each other at a right angle, but the stripes can be parallel, or of any other shape or arrangement.

The preferred embodiment includes external connections to the pattern 26 of electrically conductive stripes 28 at a periphery 30 of the article 20. In the illustrated embodiment, the article 20 incorporates the pattern 26 for the purpose of shielding against electromagnetic interference. Consequently, a common external connection for all of the electrically conductive stripes 28 is used. (In other embodiments, differing electrical connections can be used for various of the stripes.) The external connection includes an electrically conductive bus bar 32 that electrically communicates with the electrically conductive stripes 28. The external connection also includes an electrically conductive ring 34, in this case an electrically conductive O-ring 34, that contacts a mounting frame (not shown) into which the article 20 is mounted in service. Equivalently, an electrically conductive adhesive such as an electrically conductive epoxy or silicone can be used instead of the O-ring 34. The bus bar 32 and electrically conductive O-ring 34 are optional. Where they are not used, the stripes 28 float electrically.

Figure 2:
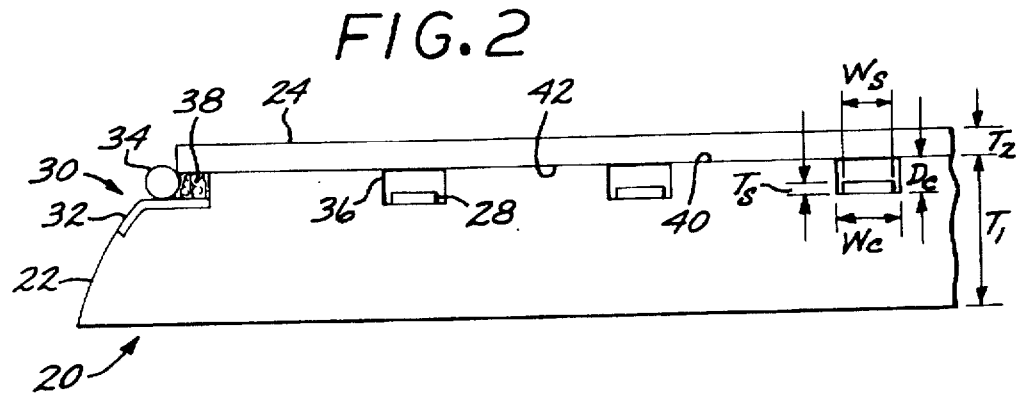
FIG. 2 is an enlarged, schematic sectional view through the article of FIG. 1, taken generally along line 2—2.

FIG. 2 is a schematic sectional view that shows features of the internal structure of the article 20. Each of the electrically conductive stripes 28 is located at the bottom of a substantially straight-sided channel 36. The channel 36 has a depth $D_C$ which is typically from about 1 micron to about 10 micrometers and a width $W_C$ that is typically from about 6 to about 10 micrometers (although different channels may have different depths and widths). The stripe has a thickness $T_S$ which is less than the depth $D_C$ of the channel 36, and which is typically from about 0.3 to about 0.9 micrometers and a width $W_S$ that is less than $W_C$ and is typically from about 6 to about 6 micrometers. The pieces 22 and 24 are joined together along a first surface 40 of the first piece 22 and a second surface 42 of the second piece 24 with a bead 38 of sealant located adjacent to the periphery 30 of the article 20 and which extends around the periphery 30 of the article 20.

Figure 3:
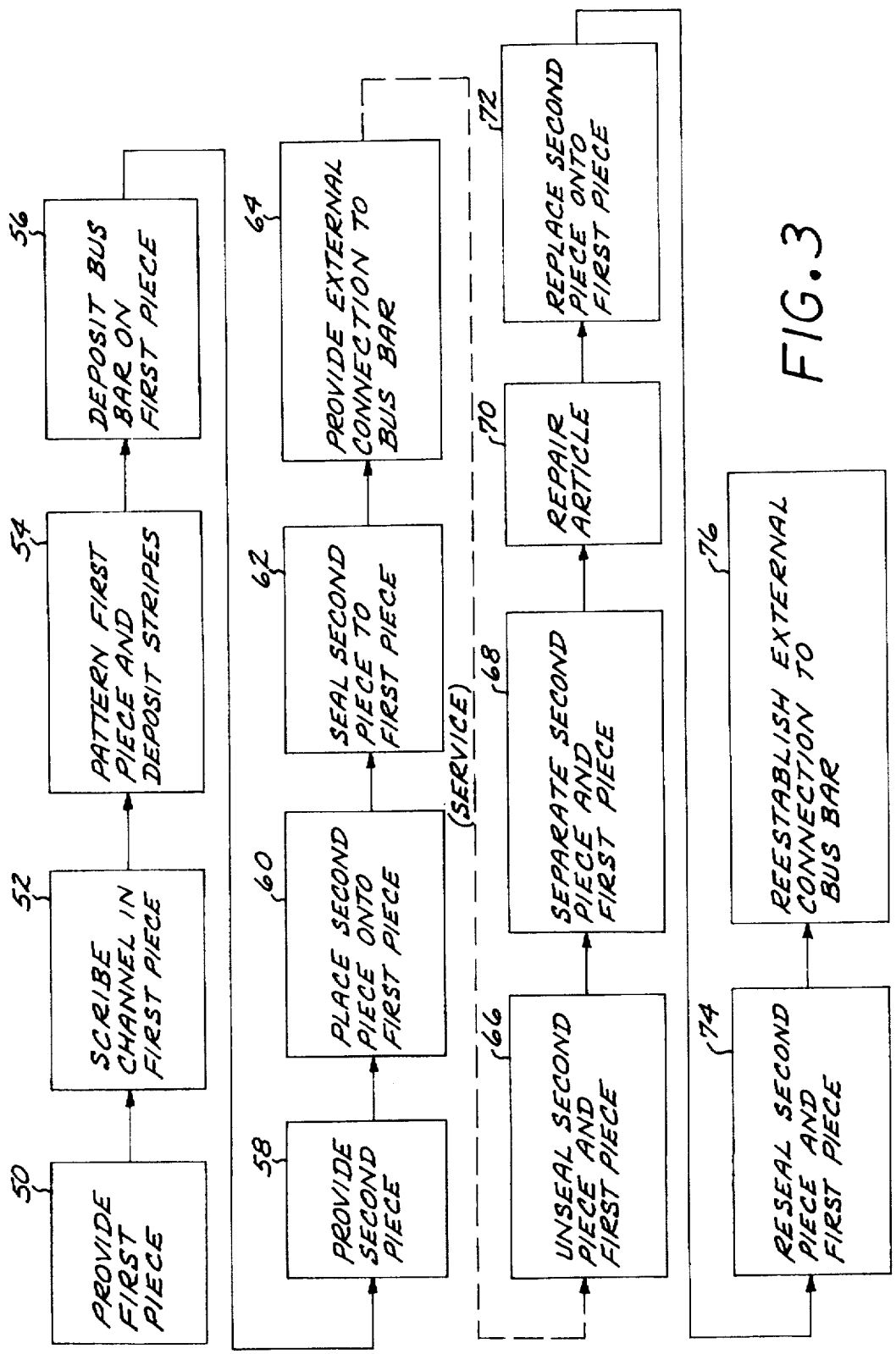
FIG. 3 is a block process flow diagram for the approach of the invention.

FIG. 3 is a block flow diagram for a method of fabricating the optically transparent article 20. The optically transparent first piece 22 is provided, numeral 50. The first piece 22 is made of a material that is transparent at the radiation wavelengths of interest. In a typical case, the first piece is made of zinc sulfide, zinc selenide, cadmium telluride, cadmium sulfide, silicon, germanium, gallium arsenide, sapphire, diamond, diamond-like carbon, or spinel, for example, so as to be transparent to radiation in the infrared. The first piece can also be made of a visible-light-transparent material such as fused silica, quartz, or soda lime glass. The first piece can be of any required thickness and lateral extent. The first piece 22 has a thickness $T_1$ sufficiently great that the first piece 22 is freestanding, typically about 0.1 inch or more. The first piece 22 is provided with the first surface 40 flat and polished to a high degree of smoothness.

The channels 36 are scribed into the first surface 40 of the first piece 22, numeral 52. The channels 36 are scribed to correspond to the desired pattern 26 of stripes 28 in the completed article 20. The channels 36 are scribed by any operable method. Preferably, the channels 36 are scribed using an ultraviolet excimer laser. Such an ultraviolet excimer laser has the characteristic that its beam ablates the material upon which it falls by a substantially adiabatic heating process in which only the material to be removed is heated and vaporized. Surrounding areas are little affected. The preferred ultraviolet excimer laser is a krypton fluoride laser operating at 248 nanometers or a laser operating at 193 nanometers. Its beam is finely focused by lenses to the size required to scribe the channels 36. The dwell time for the laser beam spot is on the order of tens of microseconds. Scribing can be accomplished by other techniques such as mechanical sawing or cutting, chemical etching, or reactive ion etching, for example.

The elongated channels 36 are scribed either by holding the first piece 22 stationary and scanning the laser beam along the required pattern, or by holding the beam stationary and moving the first piece in the required pattern. In the first approach, f-theta lenses having a focal length proportional to the exit angle of the beam from the lens are used to scan the beam over the flat surface of the first piece 22. In a typical case for scribing a zinc selenide crystal, the laser power requirement is about 100 millijoules per square centimeter. The pulse duration is about 50 microseconds, removing about 0.1 micrometers per pulse. A channel about 0.5 micrometers in depth can be scribed in about 5 pulses. In second approach, the laser beam is directed through a cylindrical lens and the first piece 22 is translated past the beam. Alternatively, a mask can be used to form a pattern in the beam, which pattern is then reduced through a reducing lens prior to falling upon the first piece.

The first piece 22 is patterned and the stripes 28 are deposited into the channels 36, numeral 54. The patterning and deposition are preferably accomplished by applying a layer of an ultraviolet-sensitive, image-reversal photoresist over the first piece 22 and scribed channels 36, by spraying or spinning. The surface of the first piece 22, with the layer of photoresist in place, is exposed to ultraviolet light through a mask. The mask is structured and aligned to prevent the ultraviolet light from impinging upon the channels 36, but to permit it to contact the remainder of the first surface 40, thereby exposing the photoresist in these areas. The exposed photoresist is processed by exposing it to infrared energy to bake it and thereafter developing the photoresist. The result is a layer of photoresist covering that portion of the surface 40 which is not within the channels 36. Metal, preferably gold, silver, aluminum, or copper, with an appropriate binder layer as necessary, is deposited over the surface 40, preferably by electron-beam evaporation or sputtering. The metal (or binder layer) deposits directly into contact with the first piece 22 in the channels 36, but over the photoresist elsewhere. The photoresist and its overlying metal are removed by washing in a solvent for the photoresist. The result is the stripes 28 of the required thickness, deposited upon the first piece 22 only at the bottoms of the channels 36.

The bus bar 32 is deposited upon the first surface 40 of the first piece 22 near to its periphery 30, numeral 56. The bus bar 32 is preferably the same material as the stripes 28 for the case where the article is a window shielded against electromagnetic interference. In other cases, such as where the stripes are used as a resistive element to heat the transparent window, the stripes would be formed of a high-resistance metal and the bus bar of a low-resistance metal such as copper. In the preferred case wherein the bus bar and the stripes are formed of the same material, the steps 54 and 56 are accomplished simultaneously in a single operation, with the bus bar 32 being the same thickness as the stripes 28.

The optically transparent second piece 24 is provided, numeral 58. The second piece 24 is made of a material that is transparent at the radiation wavelengths of interest. The second piece 24 may be made of the same material as the first piece 22, or it may be made of a different material that is transparent to the radiation wavelengths of interest. In a typical case, the second piece is made of zinc sulfide, zinc selenide, cadmium telluride, cadmium sulfide, silicon, germanium, gallium arsenide, sapphire, diamond, diamond-like carbon, or spinel, for the example of an infrared-transparent article. The second piece can also be made of a visible-light-transparent material such as fused silica, quartz, or soda lime glass, where the first piece is made of a visible-light-transparent material. The second piece can be of any required thickness and lateral extent. In a typical case, the second piece 24 has a thickness $T_2$ of about 0.01 inch or more, and has a diameter-to-thickness ratio of 20:1 or more. The second piece 24 is provided with the second surface 42 flat and polished to a high degree of smoothness.

The second piece 24 is placed into facing contact with the first piece 22, such that the second surface 42 contacts the first surface 40, numeral 60, preferably in an alignment fixture. The second piece 24 and the first piece 22 are sealed together along their periphery 30 by any operable approach, numeral 62. In the preferred approach, the pieces 22 and 24 are stacked together, and a small weight is placed on top of the second piece 24. The assembly is placed into a vacuum oven and heated to a temperature sufficiently high, typically about 150° C., to drive out any moisture from between the pieces 22 and 24. Sealing may also be accomplished without heating. In the embodiment illustrated in FIG. 2, the first piece 22 and the second piece 24 are of nearly the same lateral extent, with the first piece 22 being very slightly larger than the second piece 24. To accomplish the sealing in this case, after cooling to ambient temperature the bead 38 of sealant is placed at the periphery of the second piece 24, along the shoulder defined by the greater lateral extent of the first piece 22. This bead also fills and seals the ends of the channels 36 where not already filled with the stripe 28. The preferred sealant is a substance that is readily dissolved in an appropriate solvent, such as a cyanoacrylate. If the second piece 24 were greater in lateral extent than the first piece 22, the positioning of the bead of sealant would be reversed.

This approach to sealing is distinct from any conventional sealing approach wherein the entire surfaces 40 and 42 are bonded together with an adhesive. Such an adhesive placed into the optical path would distort or attenuate the transmitted light. The bonding of the surfaces 40 and 42 is accomplished by the smooth nature of the surfaces and the close contact therebetween, which permits atomic forces such as the Van der Waals forces to function. The sealant bead 38 acts primarily as a sealing material, not a bonding agent.

Figure 4:
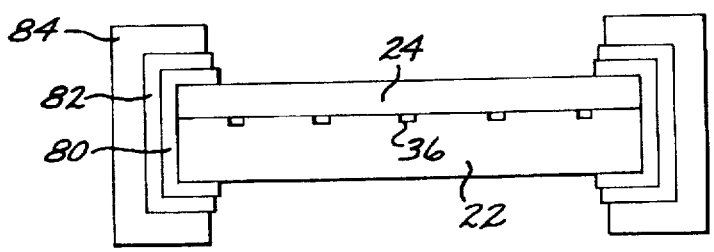
FIG. 4 is a schematic side sectional view of an approach to supporting the transparent article.

When the article 20 is to be used in severe conditions such as a high-vibration application, an external structure such as that shown in FIG. 4 can be used to prevent separation of the pieces 22 and 24. A compression ring 80 is placed around the assembly of the pieces 22 and 24, and the compression ring 80 is encased in a layer 82 of potting compound. A window frame 84 is placed over the potting compound layer 82. At a later time, the structure can be readily disassembled in the reverse order.

An external connection to the bus bar 32 is provided, numeral 64. In one application, the electrically conductive O-ring, made of graphite-filled rubber or the like, is placed around the second piece 24 to rest against the shoulder on the first piece 22 and thence in contact with the bus bar 32. This assembly is mounted against an electrically conductive support (not shown) so that electrical contact to the bus bar is made through the O-ring.

The article 20 is now finished and ready for testing and/or service. In this finished article, as shown in FIG. 2, the second piece 24 does not contact the stripes 28 because the thickness of the stripes is less than the depth of the channel. Consequently, there is no stressing of the first piece 22 and the second piece 24 laterally of the location of the stripes 28. The absence of stressing results in an absence of distortion of the light passing through the article 20 during service, which would otherwise result if the second piece 24 pressed tightly against the stripes 28.

FIG. 3 also shows additional process steps that illustrate an important advantage of one embodiment of the invention. If during testing or service, it is discovered that, for example, the second piece 24 has been pitted and must be replaced or there is a defect such as a discontinuity in one of the stripes 28, the present approach permits repair to be effected. The second piece 24 is unsealed from the first piece 22, numeral 66. For the preferred construction, unsealing is accomplished by removing the window frame 84, potting compound 82, and compression ring 80, if present, and dissolving the sealant bead using a solvent such as nitric acid. The first piece 22 and the second piece 24 are separated by applying a through-thickness thermal gradient or randomly vibrating the assembly. The second piece 24 is lifted away from the first piece 22, numeral 68. The article is repaired, numeral 70. The repair would take any necessary form specific to the nature of the defect, such as replacement of the second piece 24 or repair of the stripes 28. The second piece 24 is replaced onto the first piece, numeral 72, and resealed by the same approach as in step 62, numeral 74. The external connection to the bus bar 32 is reestablished, numeral 76, by the same approach as in step 64. This straightforward unsealing, repair, and resealing approach is not possible with conventional structures and approaches.

In another embodiment, it may be desired to permanently bond the first and second pieces together so that the steps 66–76 cannot be performed. In the case of an infrared-transparent window, materials such as polyethylene epoxy or chalcogenide glass can be used to permanently bond the first and second pieces together. For example, an $As_{20}S_{40}Se_{40}$ glass with a softening point of about 100° C. may be used to bond silicon or zinc selenide.

The present invention has been practiced using zinc selenide first and second pieces to form an infrared transparent window. The channels were formed in a rectilinear array by mechanical scribing. The channels were 5 micrometers deep, 10 micrometers wide, and spaced 200 micrometers apart. The stripe was made of gold with a chromium binding layer first deposited prior to the gold and was deposited by thermal evaporation.

The preferred embodiment has been discussed in terms of flat first and second pieces and surfaces 40 and 42. Applicant has demonstrated the ability to fabricate the pieces curved in a manner such that the surfaces 40 and 42 can be placed into bonding contact in the manner previously discussed for flat surfaces. Using this technique, curved windows with embedded meshes can be made using the present approach.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of fabricating an optically transparent article, comprising the steps of:
   providing an optically transparent first piece having a first surface and a first piece lateral periphery;
   scribing a channel into the first surface of the first piece, the channel having a channel depth;
   depositing a metallic stripe into the channel, the stripe having a metallic stripe thickness less than the channel depth;
   providing an optically transparent second piece having a second surface and a second piece lateral periphery; and
   placing the optically transparent second piece into contact with the optically transparent first piece with the second surface in contact with the first surface, the second piece not contacting the metallic stripe.

2. The method of claim 1, wherein the step of scribing includes the step of
   scribing the channel using an excimer laser.

3. The method of claim 1, wherein the step of depositing includes the steps of
   forming a mask on the first surface, the mask leaving a bottom of the channel exposed,
   depositing a layer of metal overlying the mask, and thence into the bottom of the channel, and
   removing the mask.

4. The method of claim 1, including an additional step, after the step of placing, of
   sealing the first piece to the second piece along at least one of the first piece lateral periphery and the second piece lateral periphery.

5. The method of claim 1, wherein the step of placing includes the step of
   positioning the first piece lateral periphery into alignment with the second piece lateral periphery.

6. The method of claim 5, including an additional step, after the step of placing, of
   sealing the first piece to the second piece along the aligned first piece lateral periphery and second piece lateral periphery.

7. The method of claim 1, including an additional step of providing a bus bar in contact with the metallic strip.

8. The method of claim 1, wherein the step of providing a first piece includes the step of
   providing the first piece made of a material selected from the group consisting of zinc sulfide, zinc selenide, cadmium telluride, cadmium sulfide, silicon, germanium, gallium arsenide, sapphire, diamond, diamond-like carbon, spinel, fused silica, quartz, and soda lime glass.

9. The method of claim 1, wherein the step of providing a second piece includes the step of
   providing the second piece made of a material selected from the group consisting of zinc sulfide, zinc selenide, cadmium telluride, cadmium sulfide, silicon, germanium, gallium arsenide, sapphire, diamond, diamond-like carbon, spinel, fused silica, quartz, and soda lime glass.

10. The method of claim 1, wherein the step of scribing a channel includes the step of
    scribing a plurality of intersecting channels.

11. The method of claim 1, wherein the step of providing an optically transparent first piece includes the step of
    providing the first piece having a polished first surface, and wherein the step of providing an optically transparent second piece includes the step of
    providing the second piece having a polished second surface.

12. The method of claim 4, including the additional steps, after the step of sealing, of
    unsealing the first piece and the second piece,
    separating the first piece and the second piece,
    performing a repair procedure,
    replacing the optically transparent second piece into contact with the optically transparent first piece with the second surface in contact with the first surface, the second piece not contacting the metallic stripe, and
    resealing the first piece and the second piece.

13. A method of fabricating an optically transparent article, comprising the steps of:
    providing an optically transparent first piece having a first surface and a first piece lateral periphery;
    providing an optically transparent second piece having a second surface and a second piece lateral periphery;
    scribing a channel pattern into the first surface of the first piece, the channel pattern having a channel pattern depth;
    depositing a metallic stripe pattern into the channel pattern, the metallic stripe pattern having a stripe pattern thickness less than the channel pattern depth; and
    placing the optically transparent second piece into contact with the optically transparent first piece with the second surface in contact with the first surface, the second piece not contacting the metallic stripe pattern.

14. The method of claim 13, including an additional step of providing a bus bar connection to the metallic stripe pattern.

15. The method of claim 14, wherein the step of providing a bus bar connection includes the step of
    providing a bus bar extending to the metallic stripe pattern from one of the first piece lateral periphery and the second piece lateral periphery.

16. The method of claim 14, including an additional step of
    providing an external connection to the bus bar.

* * * * *